United States Patent [19]
An

[11] Patent Number: 5,624,862
[45] Date of Patent: Apr. 29, 1997

[54] METHOD OF MAKING A MASK ROM WITH A GROOVE

[75] Inventor: Jae C. An, Seoul, Rep. of Korea

[73] Assignee: Hyundai Electronics Industries Co. Ltd., Rep. of Korea

[21] Appl. No.: 614,802

[22] Filed: Mar. 7, 1996

[30] Foreign Application Priority Data

Mar. 7, 1995 [KR]  Rep. of Korea ............... 95-4593

[51] Int. Cl.[6] ............................................. H01L 21/8246
[52] U.S. Cl. ........................ 438/276; 438/586; 438/128
[58] Field of Search ..................... 437/38, 45, 48, 437/203; 148/DIG. 50

[56] References Cited

U.S. PATENT DOCUMENTS

| | | | |
|---|---|---|---|
| 4,997,777 | 3/1991 | Boivin | 437/38 |
| 5,149,667 | 9/1992 | Choi | 437/52 |
| 5,278,089 | 1/1994 | Nakagawara | 437/48 |

*Primary Examiner*—Chandra Chaudhari
*Attorney, Agent, or Firm*—Fish & Richardson P.C.

[57] ABSTRACT

The mask ROM of the present invention is manufactured in the following processes; forming a cell array in which all the cells will be driven as on-cells, forming a groove by etching some portions of the semiconductor substrate in the drain region of the specific on-cell among the on-cells on customer's request, and then practicing a source and drain ion implantation process.

4 Claims, 6 Drawing Sheets

METHOD OF MAKING A MASK ROM WITH A GROOVE

FIELD OF THE INVENTION

The present invention relates to a method of making a mask ROM and, more particularly to a method of making a mask ROM which can improve the electrical characteristic of the mask ROM by especially improving a method of forming an off-cell.

BACKGROUND OF THE INVENTION

Mask ROMs may be mainly classified into a NOR type, a NAND type and a Flat NOR type according to the method of forming a cell array. The mask ROM on which data are written can not be rewritten. The mask ROM is manufactured in the following processes; after the cell array is formed, forming a mask for program in which the cell portion thereof, on which the off-cell will be formed, is open depending on specific applications, and then turning the specific cell to be an off-cell by way of the ion implantation process which uses the mask for program as a mask.

FIG. 1 shows a flat view of the cell array of the conventional NOR-type mask ROM cell array, and FIGS. 3A to 3D show sectional views of the cells for illustrating the method of making a conventional NOR-type mask ROM taken along with line X-X' in FIG. 1.

Referring to FIG. 1 and FIG. 3A, the field oxide film 100 is formed on a semiconductor substrate 1 by way of the device isolation technology, thereby defining the active region 200. Ion for controlling a threshold voltage is implanted into the semiconductor substrate 1 of the active region 200 so as to control the threshold voltage of the cell.

Referring to FIG. 1 and FIG. 3B, a gate oxide film 2 is formed on the semiconductor substrate 1 of the active region 200. A plurality of gate electrodes 3 are formed by depositing polysilicon in the entire structure on which the gate oxide film 2 is formed, and patterning the deposited polysilicon by way of the photolithograph and etching process. A source line 4 and a drain region 5 are formed in the semiconductor substrate 1 around the plurality of the gate electrodes 3 by way of the source and drain ion implantation process which uses the field oxide film 100 and the plurality of the gate electrodes 3 as a mask. As a result of these processes, a cell array is formed in which all the cell 101, 102 and 103 will be driven as an on-cell. In this structure, when a voltage of about 5 V is applied to the gate electrodes 3, all the cell 101, 102 and 103 are driven as the on-cells because a channel region is created on the lower portion of each of the gate electrodes 3 and thus a current turns to flow from the drain region 5 to the source line 4 through the channel region.

Thus, after the cell array is formed, the specific on-cell turns to be an off-cell on customer's request. Thus will be explained by reference to FIG. 3C.

A photoresist 6 is coated on the semiconductor substrate 1 having the plurality of the on-cells 101, 102 and 103. The photoresist 6 is patterned to open the gate electrode 3 of the specific on-cell among the plurality of the on-cells 101, 102 and 103. In order to increase the threshold voltage of the specific on-cell 103, a high concentration of ion for controlling the threshold voltage is implanted into the semiconductor substrate 1 underlying the specific on-cell 103 making use of the patterned photoresist 6 as a mask. As a result of these processes, a cell array in which the specific on-cell 103 will be driven as an off-cell 103A is formed. In this structure, when a voltage of about 5 V is applied to the gate electrodes 3, the specific on-cell 103 is driven as the off-cell 103A because a channel region is not created at the lower portion of the gate electrode 3 of the specific on-cell 103 and thus a current does not flow from the drain region 5 to the source line 4.

Referring to FIG. 3D, the patterned photoresist 6 is removed and a thick insulation film 7 is formed on the semiconductor substrate 1 having the on-cells 101 and 102 and the off-cell 103A. A contact hole 9 is formed by removing some portions of the insulation film 7 to expose the drain region 5. A bit line 8 is connected to the drain region 5 through the contact hole 9.

The NOR-type mask ROM which is manufactured according to the conventional method has a low breakdown voltage and a high leakage current at the drain region because it forms the off-cell by implanting a high concentration of ion into the specific on-cell. In addition, when the high concentration of ion is implanted into the specific on-cell so as to form the off-cell, a problem occurs which causes a decrease in the electrical characteristic of the gate oxide because the ion passes through the gate oxide.

SUMMARY OF THE INVENTION

The purpose of the present invention is to provide a method of making a mask ROM which can overcome the above mentioned problem by improving the method of forming an off-cell.

To achieve the above purpose, a method of making a mask ROM, comprising the steps of:

implanting ion for controlling a threshold voltage into a semiconductor substrate in which a field oxide film is formed and then forming a gate oxide;

forming on the gate oxide film a plurality of gate electrodes which have an etch-prevention film on the upper portion thereon, thereby forming a cell array in which all the cells will be driven as on-cells; forming a groove by etching some portions of the semiconductor substrate which are extended from the gate electrode of the specific on-cell among the on-cells, thereby forming a cell array in which the specific on-cell will be driven as an off-cell; and forming an insulation film on the entire structure in which a source line and a drain region are formed by way of the source and drain ion implantation process and then forming a bit line which is connected to the drain region through the contact process.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

Figure 1:
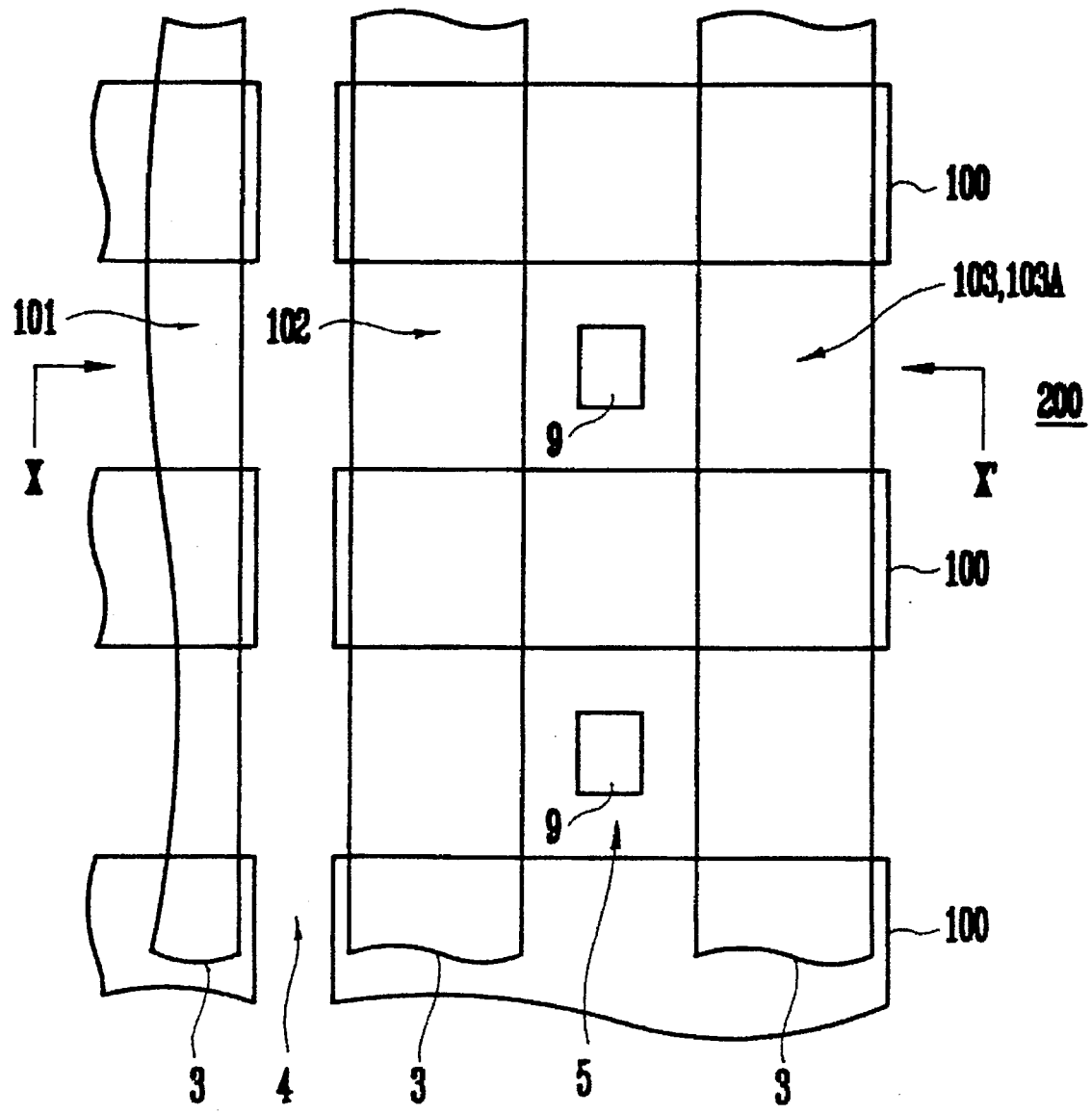
FIG. 1 shows a flat view of the cell array of a conventional NOR-type mask ROM.
Figure 2:
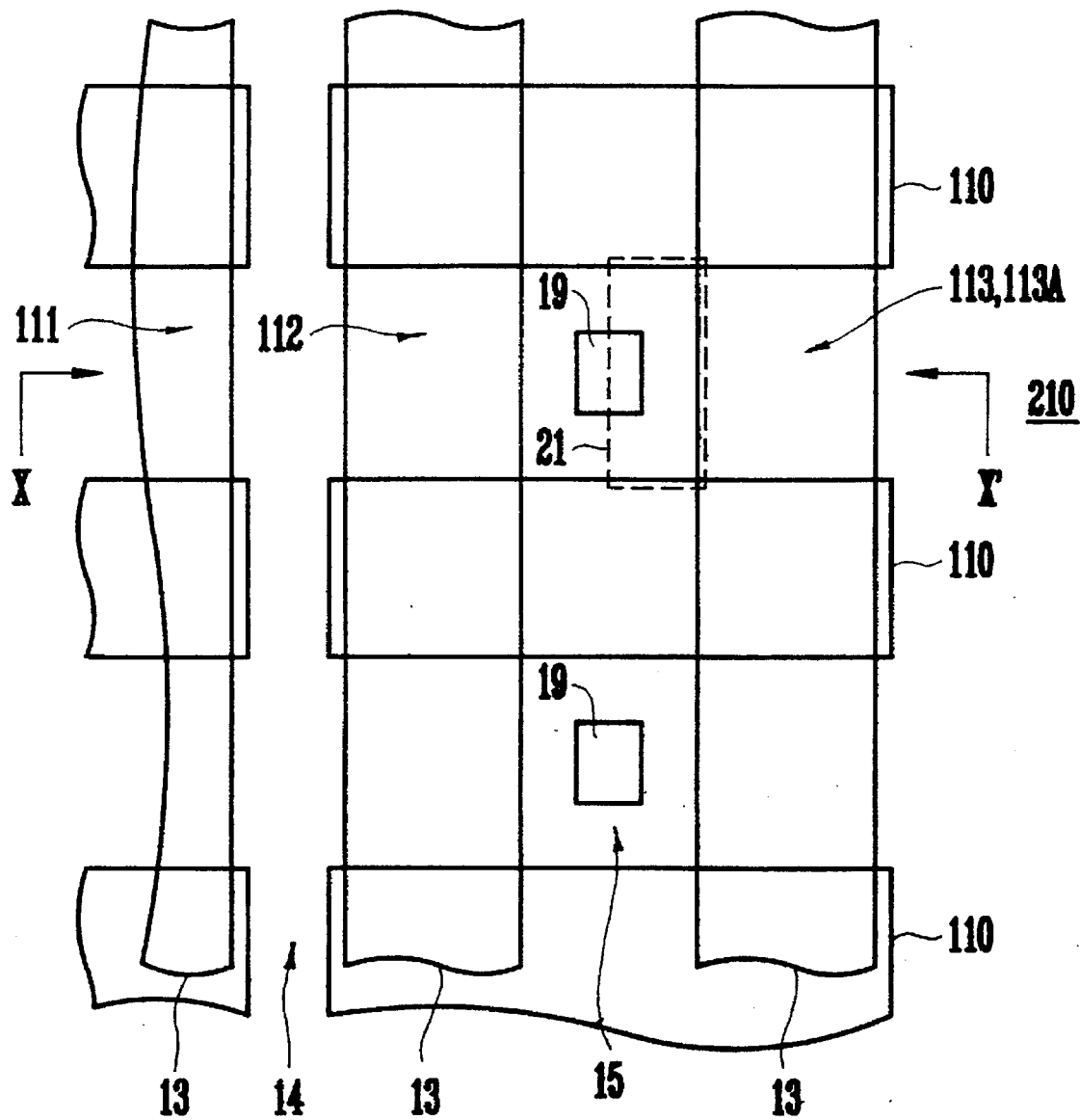
FIG. 2 shows a flat view of the cell array of the NOR-type mask ROM according to the present invention.
Figure 3A:
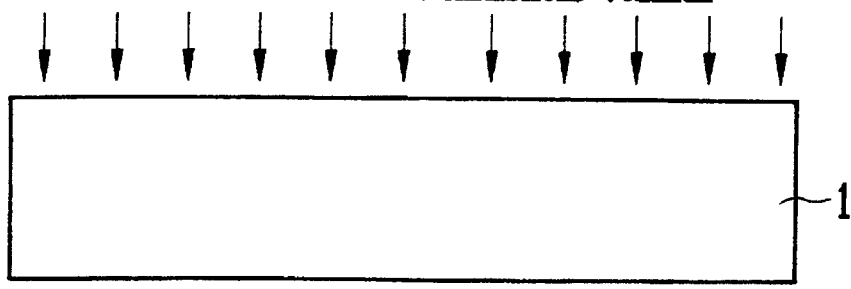
FIGS. 3A to 3D show sectional views of the cells for illustrating the method of making the conventional NOR-type mask ROM.
Figure 3B:
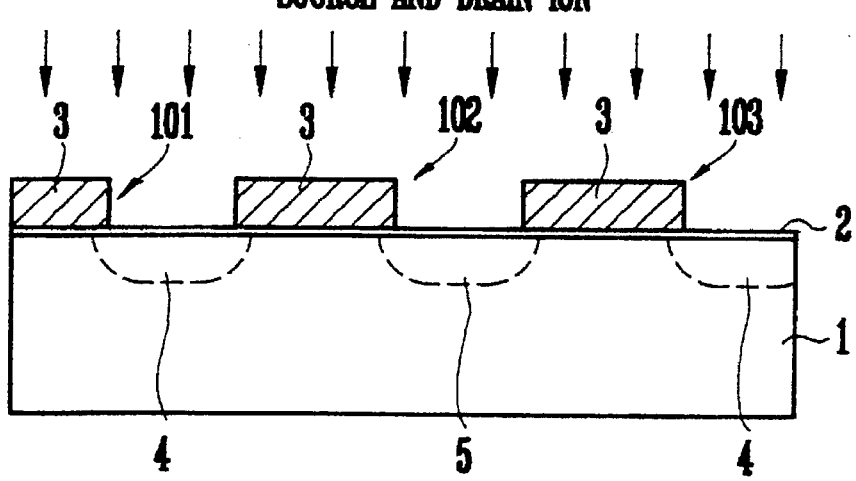
Figure 3C:
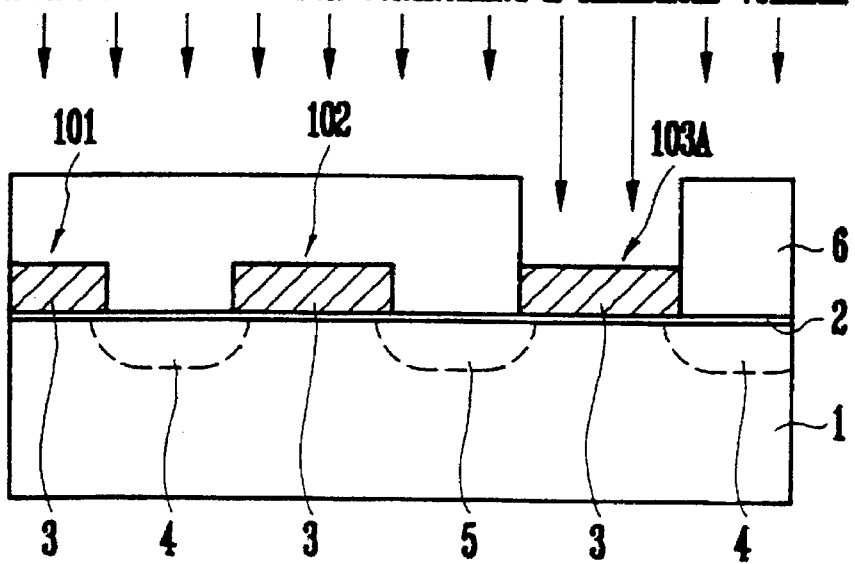
Figure 3D:
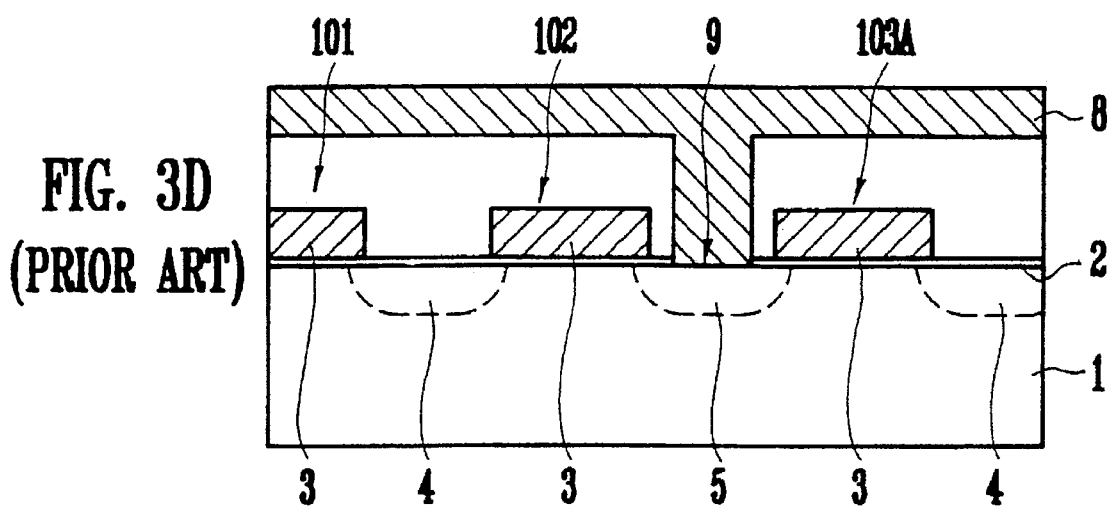

FIG. 2 shows a flat view of the cell array of the NOR-type mask ROM according to the present invention, and FIGS. 4A to 4F show sectional views of the cells for illustrating the method of making the NOR-type mask ROM taken along with line X-X' in FIG. 2.

Figure 4A:
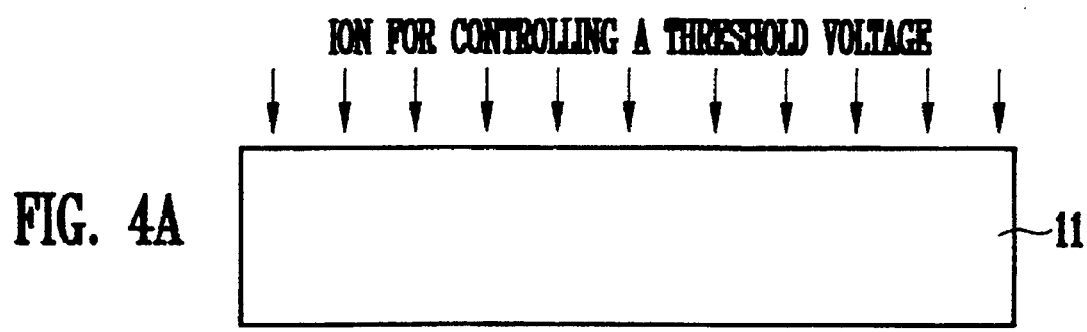
FIGS. 4A to 4F show sectional views of the cells for illustrating the method of making the NOR-type mask ROM according to the present invention.

Referring to FIG. 2 and FIG. 4A, the field oxide film 110 is formed on the semiconductor substrate 11 by way of the ion isolation technology, thereby defining the active region 210. Ion for controlling the threshold voltage is implanted into the semiconductor substrate 11 of the active region 210 so as to control the threshold voltage of the cell.

Figure 4B:
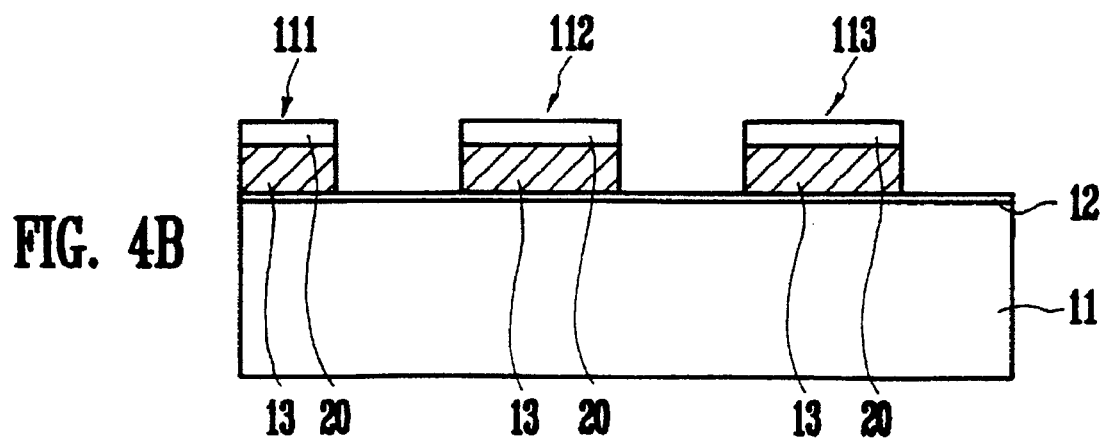

Referring to FIG. 2 and FIG. 4B, a gate oxide film 12 is formed on the semiconductor substrate 11 of the active region 210. A plurality of gate electrodes 13 having the oxide film 20 are formed on the upper portion thereof in a way that polysilicon and oxide are sequentially deposited on the entire structure in which the gate oxide film 12 is formed and then the deposited oxide and polysilicon are patterned by way of the photolithograph and etching process.

If, in this structure, the cell array is formed by way of the source and drain ion implantation process as in the conventional method, all the cell 111, 112 and 113 comprising the cell array will be driven as the on-cells.

Now, the process of making the off-cell of a specific on-cell on customer's request will be explained by reference to FIG. 4C and FIG. 4D.

Figure 4C:
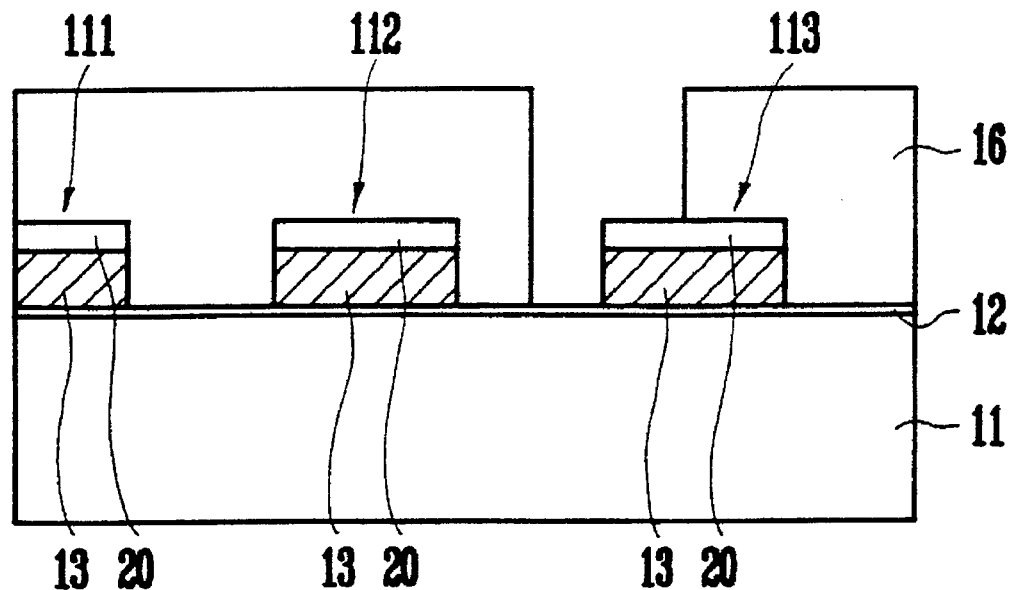

FIG. 4C shows a sectional view of the cell in which the photoresist 16 is coated on the semiconductor substrate 11 having the plurality of the on-cells 111, 112 and 113 and then the photoresist 16 is patterned to open some portions of the semiconductor substrate 11 which will become a drain region of the specific on-cell 113 gong the plurality of the on-cells 111, 112 and 113.

Figure 4D:
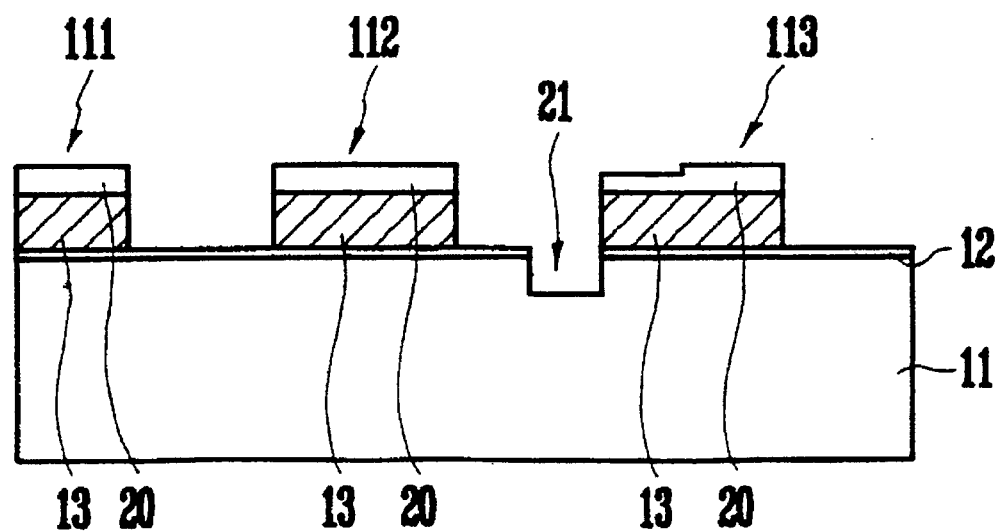

FIG. 4D shows a sectional view of the cell in which a groove 21 is formed therein in a way that the exposed portion of the gate oxide film 12 is etched by way of the etching process making use of the patterned photoresist 16 and then the exposed portion of the semiconductor substrate 11 is etched. Then, the patterned photoresist 16 is removed.

the above, when the gate oxide film 12 and the semiconductor substrate 11 are etched, the oxide film 20 acts to prevent the gate electrode 13 of the specific on-cell 113 from being etched with its thickness formed thicker than that of the gate oxide film 12.

Figure 4E:
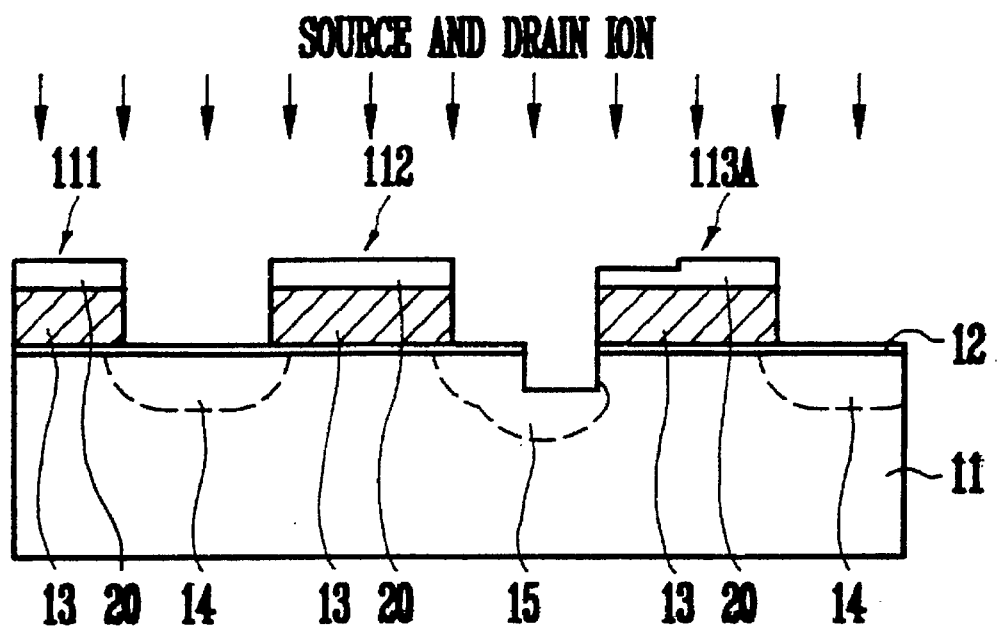

Referring to FIG. 4E, a source line 14 and a drain region 15 are formed on the semiconductor substrate 11 around the plurality of the gate electrodes 13 by way of the source and drain ion implantation process which uses the field oxide film 110 and the plurality of the gate electrodes 13 as masks. At the drain region 15 of the specific on-cell 113 is formed a groove 21 extending from the gate electrode 13 of the specific on-cell 113. Upon application of the voltage, the specific on-cell 113 is driven as the off-cell 113A due to the groove 21. As a result of these processes, a cell array in which the specific on-cell 113 will be driven as the off-cell 113A is formed. In this structure, when a voltage of about 5 V is applied to the gate electrodes 13, though a channel region is formed at the lower portion of the gate electrode 13 of the specific on-cell 113, the specific on-cell 113 is driven as the off-cell 113A because the channel region is not connected to the drain region 15 at the portion of the groove 21 and thus a current does not flow from the drain region 15 to the source line 14.

Figure 4F:
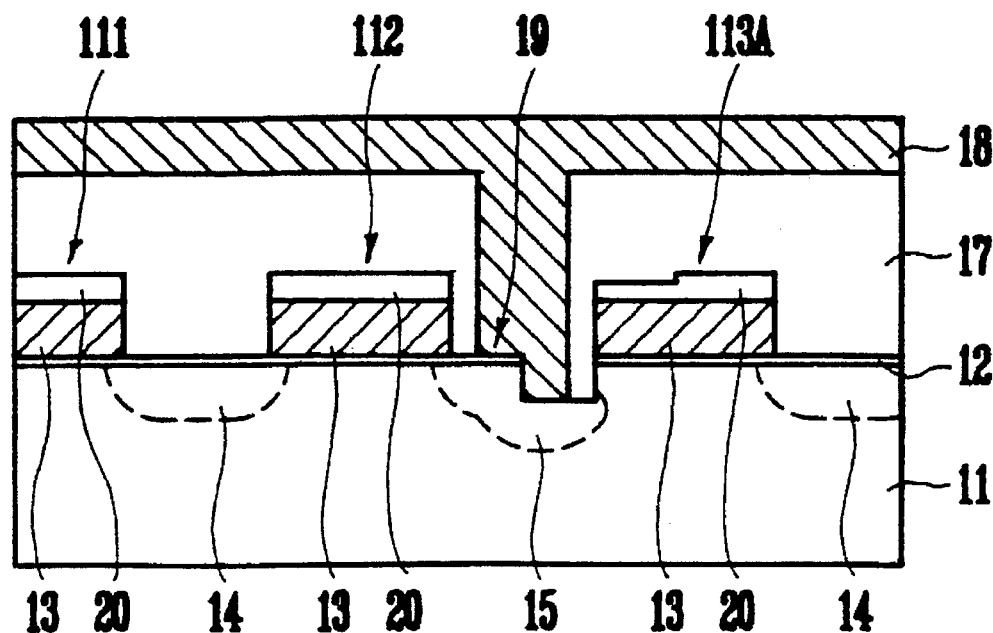

Referring to FIG. 4F, a thick insulation film 17 is formed on the semiconductor substrate 11 having the on-cells 111 and 112 and the off-cell 113A. A contact hole 19 is formed by removing some portions of the insulation film 17 to expose the drain region 15. A bit line 18 is connected to the drain region 15 through the contact hole 19.

As explained above, the present invention can solve the conventional problems such as a low breakdown voltage and a high leak current at the drain region, and also can prevent a deterioration in the electrical characteristic of the gate oxide.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

I claim:

1. A method of making a mask ROM, comprising the steps of:

implanting ion for controlling a threshold voltage into a semiconductor substrate in which a field oxide film is formed and then forming a gate oxide;

forming on said gate oxide film a plurality of gate electrodes which have an etch-prevention film on the upper portion thereon, thereby forming a cell array in which all the cells will be driven as on-cells;

forming a groove by etching some portions of said semiconductor substrate which are extended from said gate electrode of the specific on-cell among said on-cells, thereby forming a cell array in which the specific on-cell will be driven as an off-cell; and forming an insulation film on the entire structure in which a source line and a drain region are formed by way of the source and drain ion implantation process and then forming a bit line which is connected to said drain region through the contact process.

2. A method according to claim 1 wherein said etch-prevention film is formed with oxide.

3. A method according to claim 1 wherein the thickness of said etch-prevention film is formed thicker than that of said gate oxide film.

4. A method according to claim 1 wherein said groove is formed on said drain region of said specific on-cell.

\* \* \* \* \*